United States Patent [19]
Govorkov et al.

[11] Patent Number: 6,061,382
[45] Date of Patent: May 9, 2000

[54] LASER SYSTEM AND METHOD FOR NARROW SPECTRAL LINEWIDTH THROUGH WAVEFRONT CURVATURE COMPENSATION

[75] Inventors: Sergei V. Govorkov, Boca Raton, Fla.; Dirk Basting, Göttingen, Germany

[73] Assignee: Lambda Physik GmbH, Germany

[21] Appl. No.: 09/073,070

[22] Filed: May 4, 1998

[51] Int. Cl.[7] ........................................... H01S 3/08
[52] U.S. Cl. ............................................... 372/101
[58] Field of Search .............................. 372/32, 101, 102

[56] References Cited

U.S. PATENT DOCUMENTS

| | | | |
|---|---|---|---|
| 4,696,012 | 9/1987 | Harshaw | 372/99 |
| 5,095,492 | 3/1992 | Sandstrom | 372/102 |
| 5,325,378 | 6/1994 | Zorabedian | 372/101 |
| 5,684,824 | 11/1997 | Hayakawa | 372/101 |

*Primary Examiner*—Rodney Bovernick
*Assistant Examiner*—Robert E. Wise
*Attorney, Agent, or Firm*—Limbach & Limbach L.L.P.

[57] ABSTRACT

A laser system, and method of operating the same, that includes a resonant cavity that terminates at one end with a mirror and at the other end with a dispersive wavelength selector, a gain medium disposed in the resonant cavity, and a power supply that excites the gain medium to generate a laser beam that oscillates along an optical axis of the resonant cavity. The dispersive wavelength selector disperses the laser beam at different angles in a critical plane as a function of wavelength so that only a particular range of wavelengths in the beam are aligned to the optical axis and oscillate in the resonant cavity. The critical plane is parallel to the laser beam. The resonant cavity further includes a wavefront curvature compensating lens that is selectively rotatable about an axis of rotation that is perpendicular to the critical plane. The compensating lens is oriented about the axis of rotation to alter a wavefront curvature of the laser beam in the critical plane so that the wavefront curvature of the beam incident upon the wavelength selector matches the shape of the wavelength selector in the critical plane, thus minimizing a spectral linewidth of the particular range of wavelengths.

22 Claims, 2 Drawing Sheets

LASER SYSTEM AND METHOD FOR NARROW SPECTRAL LINEWIDTH THROUGH WAVEFRONT CURVATURE COMPENSATION

FIELD OF THE INVENTION

The present invention relates to laser systems, and more particularly to improved wavelength selection in a laser resonant cavity for producing narrow spectral linewidths.

BACKGROUND OF THE INVENTION

Excimer lasers are typically configured with two opposing mirrors that define a resonant cavity, and a gain medium placed therebetween. The gain medium is a gas mixture containing halogen and rare gases that is excited using electrodes to generate an intracavity laser beam that oscillates between the mirrors. Typical excimer laser systems cyclically activate the electrodes to generate a pulsed intracavity laser beam. One of the mirrors is partially transmissive to produce an output laser beam.

Excimer lasers often use a planar diffraction grating as a wavelength selector to force the laser to oscillate in a narrow linewidth. The grating reflects light of different wavelengths at different angles. The grating is aligned so that only the desired linewidth of the light reflecting therefrom is redirected back along the resonant cavity axis. Other non-desired spectral components of the laser light are reflected back to the gain medium at some angle to the optical axis of the resonator, and therefore suffer increased losses which prevent their oscillation in the resonant cavity.

In order to increase the resolution of the grating, a beam expander can be used to expand the beam and reduce its divergence by the same proportion before the beam reaches the grating. An expanded beam with less divergence gives the grating better resolution, which results in a narrower linewidth oscillating in the resonant cavity.

Even with beam expanders, there tends to be curvature in the wavefront of the light passing to the grating, which broadens the spectral linewidth of the laser since different portions of the curved wavefront strike the planar grating at slightly different angles. Therefore, spectral components of different wavelengths can be retroreflected back onto themselves and oscillate in the resonant cavity. The curved wavefront is caused by imperfections of optical components and intracavity windows, diffraction from intracavity apertures, and by a nonuniform gain profile and refractive index of the gain medium. The amount of wavefront curvature can vary during laser operation as components age and as operating conditions and optical alignment change. For example, it is well known in the art that optical elements of high average power lasers are generally subject to so called "thermal lensing" effects which is essentially power dependent through the temperature dependence of refractive index and linear expansion and distortions. Therefore, there has been a practical limit on how narrow and stable the linewidth of such a laser system can be made.

One solution to this problem is discussed in U.S. Pat. No. 5,095,492, issued to Sandstrom on Mar. 10, 1992, where the grating is bent to match its surface curvature to that of the incoming wavefront. Thus, only a very narrow band of wavelengths is reflected back along the resonant cavity axis for re-amplification. The curvature of the grating can be adjusted by changing controlled forces applied to the grating at three spaced points, which bend the grating into the desired grating curvature.

Bending the grating to match its shape to that of the incoming wavefront, however, has several disadvantages. First, applying variable forces to the grating can cause some uncontrollable distortions to the grating surface, thus limiting the precision of curvature compensation by the grating. Secondly, the grating is subject to mechanical strain which may cause the grating surface curvature to be unstable over time. Lastly, the amount of possible wavefront curvature compensation is limited. Too large a compensation can permanently bend or break the grating. Further, since the compensation is being made after the beam is expanded by the beam expander, where the divergence is smaller, the compensation is less precise.

There is a need for a simple yet reliable wavefront curvature compensator that can compensate for large variations of wavefront curvature in the intracavity beam with precision and long term stability.

SUMMARY OF THE INVENTION

The present invention solves the aforementioned problems by providing a laser resonator that includes adjustable wavefront curvature compensation that is simple and stable, so that the incoming beam wavefront shape incident upon the resonator's wavelength selector precisely matches the shape of that wavelength selector for minimum linewidth.

The resonator of the present invention includes a resonant cavity and a gain medium disposed in the resonant cavity for generating a laser beam that oscillates in the resonant cavity. The resonant cavity includes a dispersive wavelength selector and a wavefront curvature compensating lens. The dispersive wavelength selector disperses the laser beam as a function of wavelength in a critical plane so that only a particular range of wavelengths in the beam oscillates in the resonant cavity. The wavefront curvature compensating lens is disposed in the resonant cavity at a predetermined angle in the critical plane relative to the laser beam in order to alter a wavefront curvature of the laser beam to minimize a spectral linewidth of the particular range of wavelengths.

In another aspect of the present invention, the resonator includes a resonant cavity having an optical axis and a gain medium disposed in the resonant cavity for generating a laser beam that oscillates in the resonant cavity along the optical axis. The resonant cavity includes a dispersive wavelength selector and a wavefront curvature compensating lens. The dispersive wavelength selector disperses the laser beam at different angles in a critical plane as a function of wavelength so that only a particular range of wavelengths in the beam are aligned to the optical axis and oscillate in the resonant cavity. The wavefront curvature compensating lens is selectively rotatable about an axis of rotation that is perpendicular to the critical plane. The compensating lens is oriented about the axis of rotation to alter a wavefront curvature of the laser beam in the critical plane in order to minimize a spectral linewidth of the particular range of wavelengths.

In still another aspect of the present invention, a laser system includes a resonant cavity that terminates at one end with a mirror and at the other end with a dispersive wavelength selector, a gain medium disposed in the resonant cavity, and a power supply that excites the gain medium to generate a laser beam that oscillates along an optical axis of the resonant cavity. The dispersive wavelength selector disperses the laser beam at different angles in a critical plane as a function of wavelength so that only a particular range of wavelengths in the beam are aligned to the optical axis and oscillate in the resonant cavity. The resonant cavity further includes a wavefront curvature compensating lens that is selectively rotatable about an axis of rotation that is perpendicular to the critical plane. The compensating lens is oriented about the axis of rotation to alter a wavefront curvature of the laser beam in the critical plane in order to minimize a spectral linewidth of the particular range of wavelengths.

In yet another aspect of the present invention, a method of reducing spectral linewidth is disclosed in a laser system that includes a resonant cavity having an optical axis and terminating at one end with a mirror and at the other end with a dispersive wavelength selector, a gain medium disposed in the resonant cavity, a power supply for exciting the gain medium, and a lens that is selectively rotatable about an axis of rotation that is perpendicular to the optical axis, wherein the dispersive wavelength selector disperses light at different angles in a critical plane as a function of wavelength, and wherein the critical plane is perpendicular to the axis of rotation. The method includes the steps of activating the power supply to generate a laser beam that oscillates along the optical axis of the resonant cavity, and rotating the lens about the axis of rotation to minimize a spectral linewidth of wavelengths in the laser beam.

Other objects and features of the present invention will become apparent by a review of the specification, claims and appended figures.

BRIEF DESCRIPTION OF THE DRAWINGS

FIG. 1A top view of the wavefront curvature compensated laser system of the present invention.

DETAILED DESCRIPTION OF THE PREFERRED EMBODIMENTS

The present invention is a laser system with a resonant cavity 1 having adjustable wavefront curvature compensation, so that the incoming beam wavefront shape incident upon the resonator's wavelength selector precisely matches the shape of that wavelength selector.

Figure 1A:
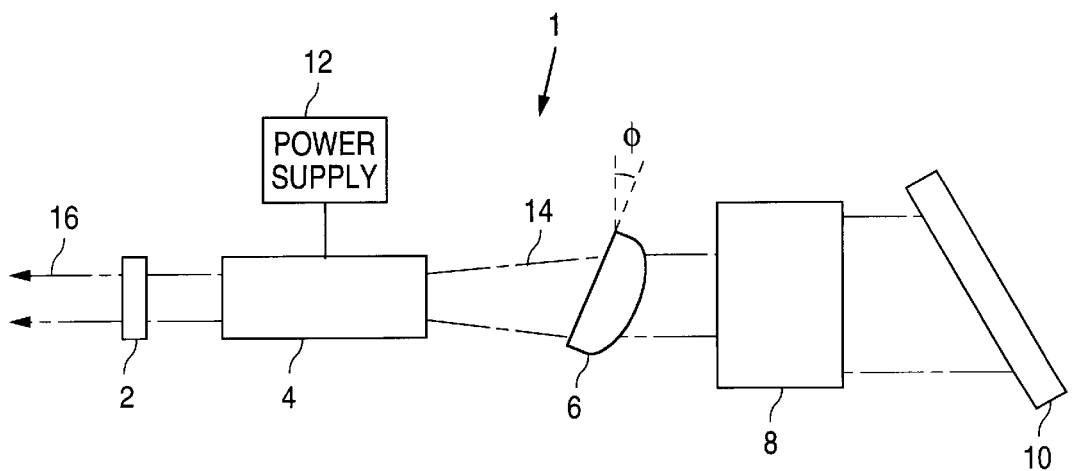
Figure 1B:
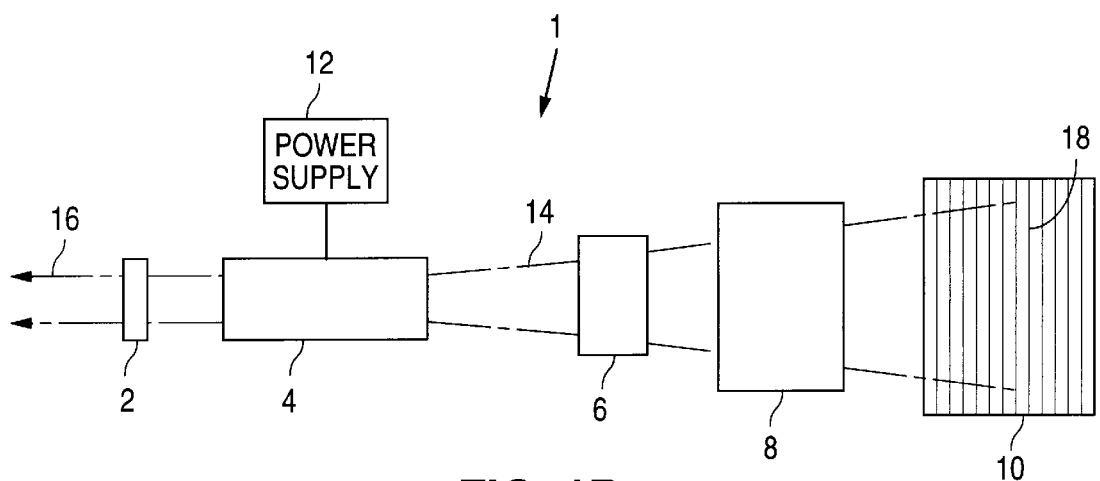
FIG. 1B is a side view of the wavefront curvature compensated laser system of the present invention.

As illustrated in FIGS. 1A and 1B, resonant cavity 1 includes a partially reflecting output coupler mirror 2, a gain medium 4, a wavefront curvature compensator lens 6, a beam expander 8 and a diffraction grating 10.

The gain medium 4 for the preferred embodiment is a cavity filled with a laser gas mixture such as halogen gas and rare gases. The gas mixture is electrically excited in a cyclical manner by a power supply 12 to produce a pulsed intracavity laser beam 14.

Output coupler mirror 2 is partially transmissive so that part of the intracavity beam 14 is transmitted out of resonator 1 as an output beam 16.

Beam expander 8 expands the intracavity laser beam 14 and reduces its divergence by the same proportion before the beam 14 reaches the grating 10. An expanded beam with less divergence gives the grating better resolution, which results in a narrower linewidth oscillating in the resonant cavity 1. The beam expander 8 can include one or more prisms, or two or more lenses that expand and collimate the intracavity beam 14.

Diffraction grating 10 is preferably a planar grating with parallel grooves or steps 18 that cause the grating 10 to reflect light of different wavelengths at different angles in the plane of dispersion. The dispersion plane (critical plane) is parallel to the intracavity beam, but perpendicular to the grooves or steps 18 of grating 10. Only a certain linewidth of wavelengths are retroreflected, in the critical plane, by grating 10 back onto themselves for oscillation in the resonant cavity 1.

Wavefront curvature compensator lens 6 is either a cylindrical, spherical or anamorphic cylindrical lens that has a focal length F close to the wavefront curvature radius of the beam 14 in the critical plane. The lens 6 is rotatably mounted in the resonant cavity 1, and selectively rotates about an axis of rotation, that is perpendicular to the beam 14 but parallel to the grating's grooves or steps 18, in order to change the tilt angle $\phi$ in the critical plane. Rotating the lens 6 about the axis of rotation (i.e. changing the tilt angle $\phi$) varies the effective focal length of the lens 6 in the critical plane by changing the angle of incidence of the beam onto the curved surface of the lens 6. This, in turn, can be viewed as reduction of the cross-section size of the lens that introduces some fixed amount of phase shift that results in wavefront curvature change and, therefore, shorter focal length. In small angle $\phi$ approximation, such change is proportional to the factor $\cos(\phi)$, where $\phi=0$ corresponds to normal incidence. For larger angles, exact dependence is obtainable by ray tracing as illustrated below. For complete wavefront curvature compensation, the focal length of the lens should be equal to the radius of wavefront curvature in the critical plane, since the wavefront curvature of the optical beam is transformed upon passing a thin lens with effective focal length F as:

$$\frac{1}{R_1} - \frac{1}{F} = \frac{1}{R_2} \qquad (1)$$

where $R_1$ and $R_2$ are the incident and transmitted beam's wavefront curvatures, and the beam is assumed to be diverging (has a positive radius of curvature). From this formula, it is clear that both the diverging and converging beams can be compensated for by selecting positive or negative lenses respectively. By tilting the lens 6 about its axis of rotation, the effective focal length F of the lens 6 in the critical plane can be increased or decreased to match the wavefront curvature radius.

Figure 2:
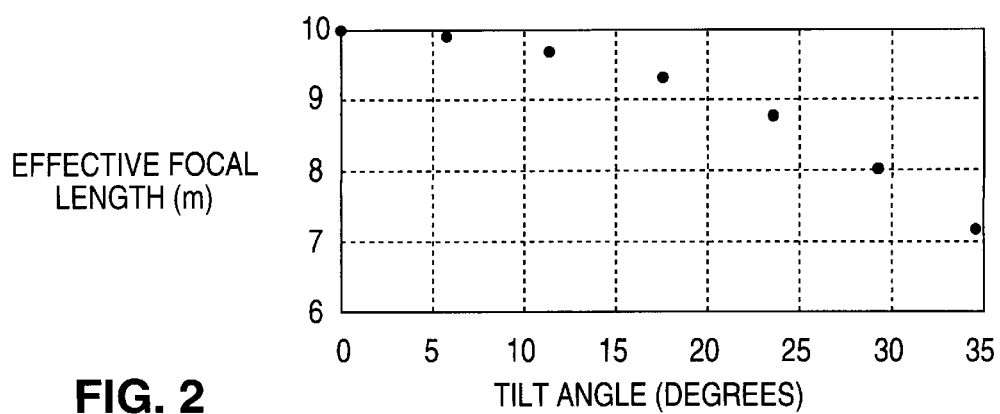
FIG. 2 is a graph illustrating the variation of effective focal length of the wavefront curvature compensator lens as a function of tilt angle.

FIG. 2 illustrates the dependence of the effective focal length F of a plano-convex cylindrical lens, with a nominal focal length of 10 meters, as a function of tilt angle $\phi$ in the critical plane. This dependence is obtained using ray tracing, assuming the radius of curvature of the convex cylindrical surface is R=5 m and the refractive index of the lens is n=1.5, and assuming the lens 6 is relatively thin. Cylindrical aberrations result in only a 1 mm spread in effective focal length over the 10 mm beam diameter, for tilt angles up to 35 degrees. As can be seen by FIG. 2, a range of wavefront curvature radii of almost 3 meters can be compensated for with ±35 degrees of lens tilt angle.

The rotatable lens 6 provides continuous adjustment for varying wavefront curvatures. The beam's wavefront curvature can change during the operation of the laser system, for example, by changing the magnitude of the thermal lensing effect in optical elements. The lens 6 can be easily and quickly rotated as the wavefront curvature changes to maintain the minimum spectral linewidth possible. In actuality, the beam expander 8 can change the wavefront curvature of the beam travelling to the grating. Therefore, the lens 6 is rotated until the wavefront curvature of the beam that is incident upon the grating best matches the shape of the grating in the critical plane. At that point, the minimum linewidth is achieved.

Figure 3:
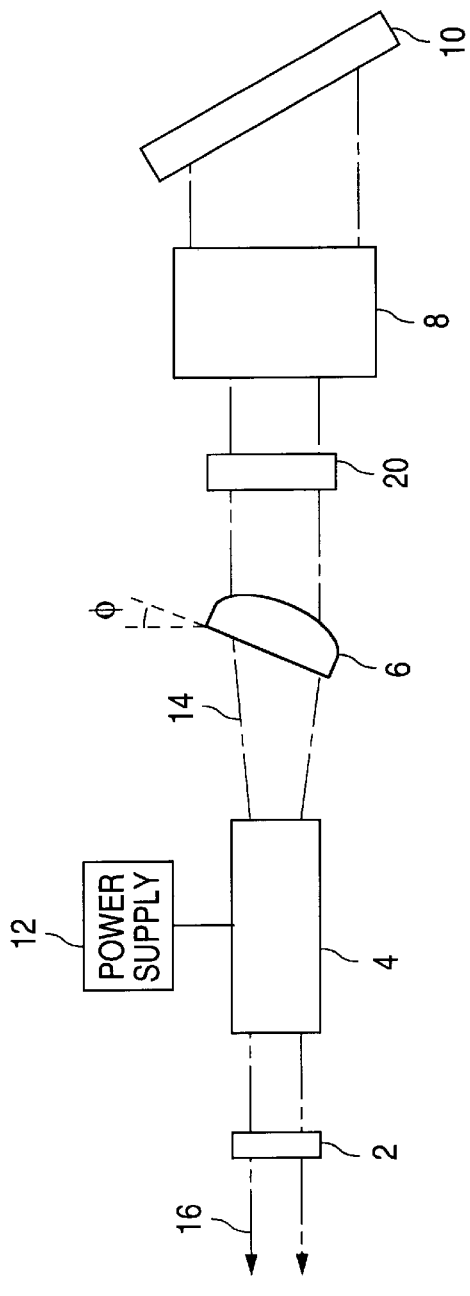
FIG. 3 is a top view of the laser system with multiple wavefront curvature compensator lenses.

For narrowing the spectral linewidth of the laser, it is only necessary to compensate for wavefront curvature in the critical plane of the grating. This plane is also the principal plane of the beam expander. However, the wavefront curvature compensator lens 6 can also be constructed of a lens that has curvature compensation in the non-critical plane of the grating (which is orthogonal to the critical plane). Wavefront compensation in the non-critical plane may be useful in reducing diffraction losses in the resonator. Therefore, the compensating lens 6 can be spherical or anamorphic, or a second compensator lens 20 can be added with its curvature aligned to the non-critical plane of the grating (see FIG. 3). Alternately, the compensator lens 6 can be formed of a single lens 6 with cylindrical surfaces on both sides which are aligned in perpendicular planes.

Once aligned and the rotation angle fixed, the wavefront curvature compensator lens 6 provides stable and precise wavefront curvature compensation to the intracavity beam 14. Further, if the wavefront curvature changes over time, the operator can adjust the rotation angle of lens 6 to compensate for the changes. Finally, since the wavefront curvature compensation occurs before the beam is expanded by expander 8, a more accurate wavefront curvature compensation is possible since the expander 8 acts as an angle de-magnifier.

The effect of the wavefront curvature compensator lens of the present invention is best illustrated as applied to an excimer laser having a discharge width of 10 mm and a discharge length of 1 meter. The wavefront curvature radius is approximately 10 meters. This corresponds to a variation of incidence angle onto the grating of approximately 1 mrad across the diameter of the beam. If an expander with an expansion ratio of 20 is used, then the angle variation range is reduced to 50 $\mu$rad following the expander. If the diffraction grating is orientated at 55 degrees, then its spectral dispersion is approximately 9.5 mrad per nm at a wavelength of 300 nm. Therefore, the resolution of such a wavelength selector is limited to approximately 5 picometers solely due to wavefront curvature. However, if a wavelength compensator lens 6 is used which has an effective focal length matching the radius of curvature of the beam, the spectral linewidth is determined by factors other than the wavefront curvature, namely effective acceptance angle of the resonator, spatial coherent of the beam, and others. Since a resonator of this kind is known to produce a linewidth of roughly 5 to 10 pm without wavefront curvature compensation, elimination of curvature effects that lead to at least 5 pm of linewidth broadening results in substantial narrowing of the spectral linewidth.

Figure 4:
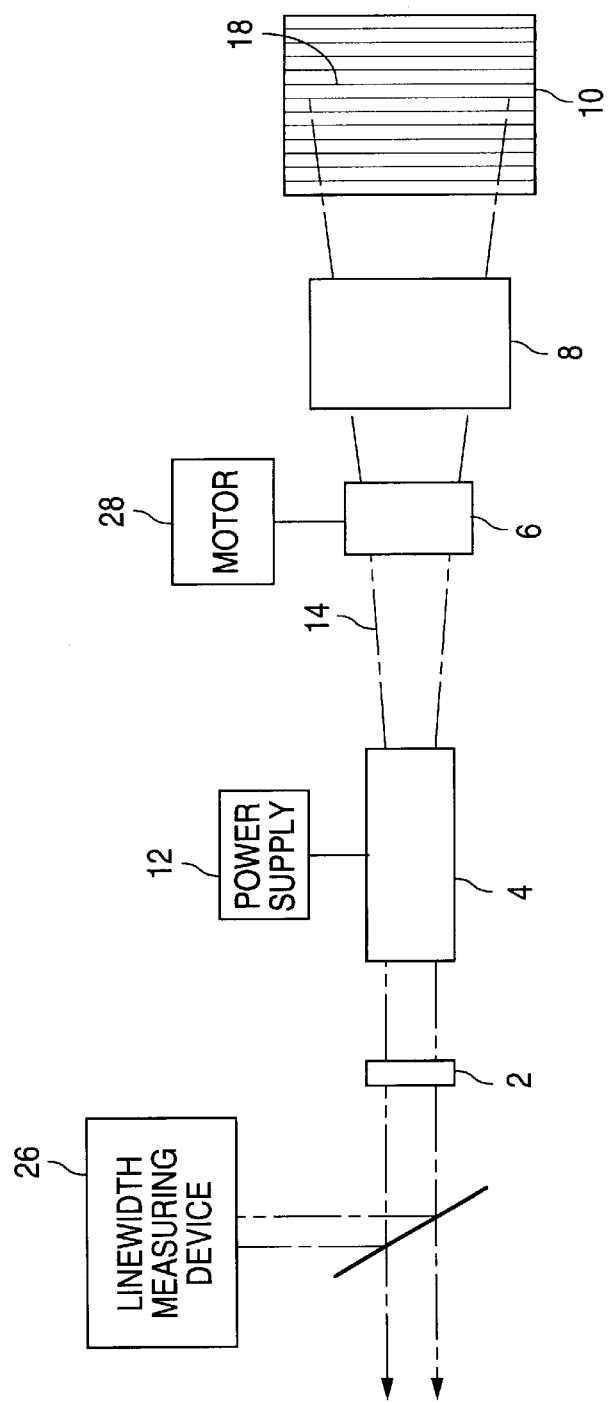
FIG. 4 is a side view of the wavefront curvature compensated laser system with a motor and linewidth detector for automated wavefront curvature compensation.

FIG. 4 illustrates a linewidth measuring device 26, such as an optical etalon coupled to an optical sensor array, which measures the spectral linewidth of the output beam 16. Compensator lens 6 is mounted on a rotation motor 28, such as a galvanometer or stepper motor or DC motor, which controls the tilt angle $\phi$ of the compensator lens. The rotation motor 28 is responsive to the external measuring device 26, and automatically adjusts the tilt angle $\phi$ of the compensator lens 6 to maintain a minimum spectral linewidth in the output beam 16.

It is to be understood that the present invention is not limited to the embodiments described above and illustrated herein, but encompasses any and all variations falling within the scope of the appended claims. For example, while the preferred embodiment of the resonator 1 is illustrated in a pulsed excimer laser system using a gain cavity with an excimer gas mixture, the laser resonator 1 of the present invention can be used in any appropriate laser system with any appropriate gain medium, CW or pulsed. Further, while the grating 10 illustrated herein is planar, a non-planar grating can be used so long as the wavefront curvature compensating lens can match the wavefront curvature incident on the grating to the curvature of the grating in the critical plane.

What is claimed is:

1. A resonator for a laser, comprising:
   a resonant cavity; and
   a gain medium disposed in the resonant cavity for generating a laser beam that oscillates in the resonant cavity;
   the resonant cavity including:
   a dispersive wavelength selector that disperses the laser beam as a function of wavelength in a critical plane so that only a particular range of wavelengths in the beam oscillates in the resonant cavity, and
   a wavefront curvature compensating lens disposed in the resonant cavity at a predetermined angle in the critical plane relative to the laser beam in order to alter a wavefront curvature of the laser beam to minimize a spectral linewidth of the particular range of wavelengths.

2. The resonator as recited in claim 1, wherein the resonant cavity further comprises:
   a beam expander that expands the laser beam before the laser beam reaches the dispersive wavelength selector.

3. The resonator as recited in claim 2, wherein the beam expander is disposed between the dispersive wavelength selector and the compensating lens.

4. The resonator as recited in claim 2, wherein the dispersive wavelength selector is a dispersive grating, and wherein the predetermined angle is selected such that the compensating lens matches the wavefront curvature of the beam incident on the grating to the shape of the grating in the critical plane.

5. A resonator for a laser, comprising:
   a resonant cavity having an optical axis; and
   a gain medium disposed in the resonant cavity for generating a laser beam that oscillates in the resonant cavity along the optical axis;
   the resonant cavity including:
   a dispersive wavelength selector that disperses the laser beam at different angles in a critical plane as a function of wavelength so that only a particular range of wavelengths in the beam are aligned to the optical axis and oscillate in the resonant cavity, and
   a wavefront curvature compensating lens selectively rotatable about an axis of rotation that is perpendicular to the critical plane, wherein the compensating lens is oriented about the axis of rotation to alter a wavefront curvature of the laser beam in the critical plane in order to minimize a spectral linewidth of the particular range of wavelengths.

6. The resonator as recited in claim 5, wherein the resonant cavity further comprises:
   a beam expander disposed between the gain medium and the wavelength selector, the beam expander expands the laser beam before the laser beam reaches the dispersive wavelength selector.

7. The resonator as recited in claim 6, wherein the beam expander is disposed between the dispersive wavelength selector and the compensating lens.

8. The resonator as recited in claim 6, wherein the dispersive wavelength selector is a dispersive grating, and wherein the compensating lens orientation is selected so that the wavefront curvature of the beam incident on the grating matches the shape of the grating in the critical plane.

9. The resonator as recited in claim 8, wherein the dispersive grating is a planar grating, and wherein the compensating lens orientation is selected to minimize the wavefront curvature of the beam incident on the grating.

10. The resonator as recited in claim 6, wherein the compensating lens has a focusing surface that changes a wavefront curvature of the beam in a non-critical plane which is orthogonal to the critical plane.

11. The resonator as recited in claim 10, wherein the dispersive wavefront curvature compensating lens includes:
a first cylindrical focusing surface oriented in the critical plane, and
a second cylindrical focusing surface oriented in the non-critical plane.

12. The resonator as recited in claim 5, wherein the dispersive wavelength selector comprises a prism and a reflective mirror.

13. The resonator as recited in claim 5, further comprising:
a spectral linewidth measuring device that measures the spectral linewidth of the particular range of wavelengths in the beam; and
a rotation motor attached to the compensator lens that controls the angular rotation of the compensator lens about the axis of rotation, wherein the rotation motor is responsive to the spectral linewidth measuring device to automatically maintain a minimized spectral linewidth of the particular range of wavelengths in the beam.

14. A laser system comprising:
a resonant cavity terminating at one end with a mirror and at the other end with a dispersive wavelength selector;
a gain medium disposed in the resonant cavity;
a power supply that excites the gain medium to generate a laser beam that oscillates along an optical axis of the resonant cavity;
the dispersive wavelength selector disperses the laser beam at different angles in a critical plane as a function of wavelength so that only a particular range of wavelengths in the beam are aligned to the optical axis and oscillate in the resonant cavity, wherein the critical plane is parallel to the laser beam; and
the resonant cavity includes a wavefront curvature compensating lens that is selectively rotatable about an axis of rotation that is perpendicular to the critical plane, wherein the compensating lens is oriented about the axis of rotation to alter a wavefront curvature of the laser beam in the critical plane in order to minimize a spectral linewidth of the particular range of wavelengths.

15. The laser system as recited in claim 14, wherein the resonant cavity further comprises:

a beam expander disposed between the dispersive wavelength selector and the gain medium, the beam expander expands the laser beam before the laser beam reaches the dispersive wavelength selector.

16. The laser system as recited in claim 15, wherein the beam expander is disposed between the dispersive wavelength selector and the compensating lens.

17. The laser system as recited in claim 15, wherein the dispersive wavelength selector is a dispersive grating, and wherein the compensating lens orientation is selected so that the wavefront curvature of the beam incident on the grating matches the shape of the grating in the critical plane.

18. The laser system as recited in claim 17, wherein the dispersive grating is a planar grating, and wherein the compensating lens orientation is selected to minimize the wavefront curvature of the beam incident on the grating.

19. The laser system as recited in claim 15, wherein the compensating lens has a focusing surface that changes a wavefront curvature of the beam in a non-critical plane which is orthogonal to the critical plane.

20. The laser system as recited in claim 19, wherein the dispersive wavefront curvature compensating lens includes:
a first cylindrical focusing surface oriented in the critical plane, and
a second cylindrical focusing surface oriented in the non-critical plane.

21. The laser system as recited in claim 14, further comprising:
a spectral linewidth measuring device that measures the spectral linewidth of the particular range of wavelengths in the beam; and
a rotation motor attached to the compensator lens that controls the angular rotation of the compensator lens about the axis of rotation, wherein the rotation motor is responsive to the spectral linewidth measuring device to automatically maintain a minimized spectral linewidth of the particular range of wavelengths in the beam.

22. A method of reducing spectral linewidth in a laser system that includes a resonant cavity having an optical axis and terminating at one end with a mirror and at the other end with a dispersive wavelength selector, a gain medium disposed in the resonant cavity, a power supply for exciting the gain medium, and a lens that is selectively rotatable about an axis of rotation that is perpendicular to the optical axis, wherein the dispersive wavelength selector disperses light at different angles in a critical plane as a function of wavelength, and wherein the critical plane is perpendicular to the axis of rotation, the method comprising the steps of:
activating the power supply to generate a laser beam that oscillates along the optical axis of the resonant cavity; and
rotating the lens about the axis of rotation to minimize a spectral linewidth of wavelengths in the laser beam.

* * * * *